United States Patent [19]
Rastegar et al.

[11] Patent Number: 5,329,560
[45] Date of Patent: Jul. 12, 1994

[54] AGC CIRCUIT WITH NON-LINEAR GAIN FOR USE IN PLL CIRCUIT

[75] Inventors: Ali J. Rastegar, Santa Clara, Calif.; Francesco Carobolante, Phoenix, Ariz.

[73] Assignee: SGS-Thomson Microelectronics, Inc., Carrollton, Tex.

[21] Appl. No.: 885,489

[22] Filed: May 19, 1992

[51] Int. Cl.⁵ .......................... H04L 27/08; H03D 3/24
[52] U.S. Cl. .................................... 375/120; 331/1 A; 318/799; 318/814
[58] Field of Search ...................................... 375/81–82, 375/94, 98, 120; 331/1 A, 1 R, 13, 17, 25; 328/155; 314/138, 268; 318/799, 801, 811, 813–814

[56] References Cited
U.S. PATENT DOCUMENTS 4,816,722  3/1989  Shigemori ........................ 331/1 A
5,086,261  2/1992  Sakata et al. .................... 318/268

Primary Examiner—Stephen Chin
Assistant Examiner—Young Tse
Attorney, Agent, or Firm—Kenneth C. Hill; Lisa K. Jorgenson; Richard K. Robinson

[57] ABSTRACT

A circuit and method for generating drive signals having a frequency synchronized to a reference frequency signal is disclosed. The circuit includes a PLL that includes a motor, and a circuit for generating a signal having a frequency proportional to the speed of the motor. A phase detector produces a signal for a time proportional to a phase difference between the motor speed signal and a reference frequency signal. A first phase difference measuring circuit produces a first voltage output signal at a first gain proportional to the phase difference when the duration of the phase detector signal is less than a predetermined time. A second phase difference measuring circuit produces a second output signal at a second gain when the duration of the phase detector signal is greater than the predetermined time. The first and second output signals are summed and applied to control the speed of the motor.

22 Claims, 2 Drawing Sheets

AGC CIRCUIT WITH NON-LINEAR GAIN FOR USE IN PLL CIRCUIT

BACKGROUND OF THE INVENTION

1. Field of the Invention

This invention relates to improvements in phase-locked loop circuitry and methods for operating same, and to improvements in circuitry and methods for reducing steady state error and increasing the capture range of a PLL during convergence by automatically changing the gain applied to the signal from the phase detector.

2. Technical Background

This invention pertains to phase-locked loop circuits of the type that use a phase detector, an integrating filter, and a variable frequency circuit in a feedback configuration to track accurately an input signal at a reference frequency. In a broad sense, the variable frequency circuit can be a voltage-controlled oscillator (VCO), but in the embodiment illustrated herein, the variable frequency circuit includes a variable speed motor and a generator that produces a signal of frequency dependent upon the speed of the motor. The phase of the variable frequency signal with respect to the reference frequency is determined by the phase detector, and the phase detector generates a dc voltage signal, which may be filtered by the integrating filter, to control the variable frequency signal, for example, by controlling the frequency of a VCO or by controlling the speed of the motor. The voltage signal forces the VCO to compensate, or changes the speed of the motor, when the variable frequency drifts from the reference frequency.

Typically when the PLL begins operation, the variable frequency requires a certain time to converge to the frequency of the input signal, until "lock" occurs. When lock occurs, the variable frequency tracks the input signal, and the PLL circuit functions in a feedback mode to maintain the lock. As known in the art, a higher gain applied to the signal from the phase detector reduces the steady state operation error. On the other hand, a low gain applied to the phase detector output signal widens the lock, or capture, range.

What is needed is a circuit and method that will provide a lower gain when the phase error between the reference frequency and the variable frequency is large, during convergence, and a higher gain when the phase error is low, when lock has been, or is close to being, attained. The circuit and method should provide multiple break points (changes in the gain) in the transfer function if desired, so that a smooth and approximately linear change of phase detector output voltage is obtainable, and the PLL performance can be maximized.

SUMMARY OF THE INVENTION

In light of the above, therefore, it is an object of the invention to provide an improved apparatus and method for reducing steady-state error of a PLL circuit.

It is another object of the invention to provide a method and circuit for increasing the capture range bandwidth in the operation of a PLL circuit.

It is another object of the invention to provide a PLL circuit in which the gain of the phase detector automatically increases when the PLL circuit is operating in locked-mode and lowers the gain when the circuit is operating in a convergence mode.

It is another object of the invention to provide an improved apparatus and method of the type described that uses a "coarse" phase-error detector circuit that operates with a low gain, and a "fine" detector circuit that operates with a high gain, and that holds the "coarse" circuit inactive unless the "fine" circuit reaches a predetermined phase error limit.

It is another object of the invention to provide an improved apparatus and method of the type described that may be easily designed to provide multiple breakpoints in the transfer function by enabling more gain paths to be added in parallel.

It is still another object of the invention to provide an improved apparatus and method of the type described to reduce steady-state error, and increase capture range bandwidth, in the operation of a PLL circuit used for driving a motor.

It is yet another object of the invention to provide an improved circuit having the advantages of the above described method and apparatus that can be integrated in a single integrated-circuit chip.

These and other objects, features, and advantages of the invention will be apparent to those skilled in the art from the following detailed description of the invention, when read with the drawings and appended claims.

According to a first broad aspect of the invention, a PLL circuit for generating drive signals to control the speed of a motor according to a reference frequency is provided. A motor speed circuit generates a speed signal of frequency proportional to the speed of the motor, and a phase detector produces a signal of duration proportional to a phase difference between the speed signal and the reference frequency signal. A phase difference measuring circuit produces a first output signal at a first gain proportional to the phase difference when the duration of the phase detector signal is less than a predetermined time and produces a second output signal at a second gain less than the first gain when the duration of the phase detector signal is greater than the predetermined time. The first and second output signals are summed to produce a summed signal that is applied to a motor driver circuit for controlling the speed of the motor.

According to another broad aspect of the invention, a PLL circuit controls a variable frequency signal to be synchronized to a reference frequency signal. The circuit includes a circuit to generate a speed signal proportional to the speed of the motor. A phase detector produces a signal for a duration proportional to the phase difference between the speed signals and the reference frequency signal. A first phase difference measuring circuit produces a first output signal at a first gain proportional to the phase difference when the duration of the phase detector signal is less than a predetermined time, and a second phase difference measuring circuit produces a second output signal at a second gain when the duration of the phase detector signal is greater than the predetermined time. The first and second output signals are summed for application to control the speed of the motor.

In one embodiment, the first gain is larger than the second gain, the difference due to clocks at first and second frequencies to clock first and second digital counters. The second digital counter is enabled only when the first counter saturates, so that the first counter controls the operation of the circuit at and near lock, and the second controls the operation of the circuit during convergence toward the lock range.

According to yet another broad aspect of the invention, a method for generating a drive signal provides for generating a pulse of length proportional to a phase difference between a reference signal and a resultant signal affiliated to the drive signal to which the drive signal is to be synchronized. A first control signal is generated at a first gain. The first control signal operates within a first range of phase difference between the resultant signal and a reference signal. A second control signal is generated at a second gain lower than the first gain. The second control signal operates within a second range of phase difference between the resultant signal and a reference signal larger than the first range of phase difference. The first and second control signals are summed, and the drive signals are modified according to the summed first and second control signals.

DETAILED DESCRIPTION OF THE PREFERRED EMBODIMENT

Figure 1:
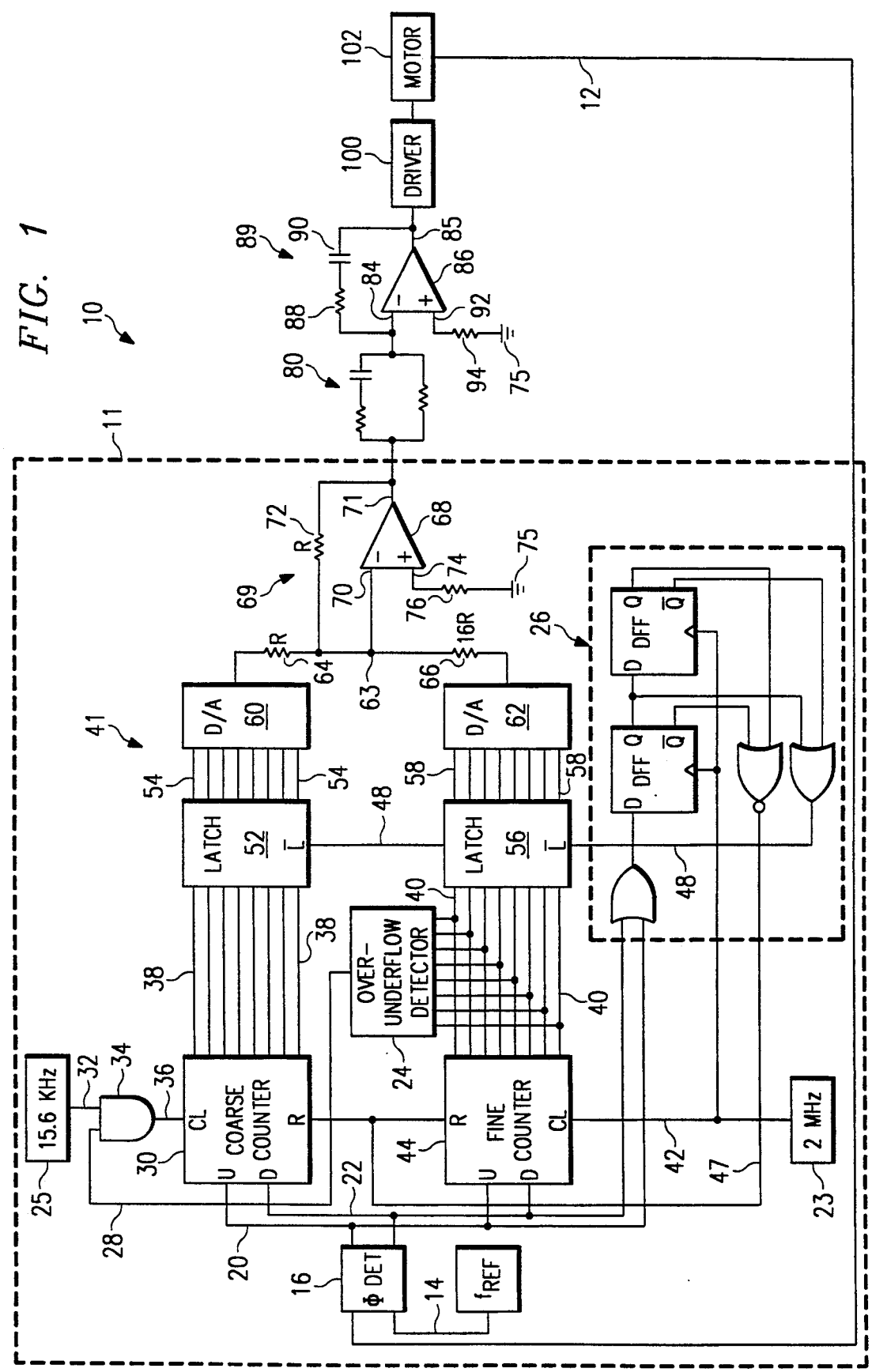
FIG. 1 is an electrical schematic diagram of a PLL circuit with non-linear gain according to a preferred embodiment of the invention for driving a motor that can be connected to the PLL circuit.

An electrical schematic diagram of a PLL circuit 10 incorporates an automatic gain control (AGC) circuit 41 with non-linear gain according to a preferred embodiment of the invention, as shown in FIG. 1. Although the PLL circuit 10 can be constructed of discrete components, preferably all or portions of it can be integrated onto a single integrated-circuit device. Also, although the circuit has particular application with motor driving circuits, it is to be appreciated that the PLL circuit 10 may find application in many other types of circuits.

The AGC circuit 41 serves to create an analog voltage at a low gain to the input of a motor driving circuit 100 during the initial circuit startup mode, or if an event occurs that causes the PLL to lose lock. In such instances, a motor speed signal on line 12 to be tracked by the PLL circuit and the reference frequency on line 14 are of greatly differing frequencies. The motor speed signal can be, for instance, a signal of spaced pulses based upon rotor position representing the speed of rotation of the rotor. On the other hand, the AGC circuit 41 also serves to create a voltage at a high gain to the input of the motor driver circuitry 100 once a lock range has been reached by the PLL circuit 10, or the phase error is relatively small.

The PLL circuit 10 uses a phase detector 11 that includes a frequency/phase detector 16, a pair of up-down counters 30 and 44, a pair of latches 52 and 56, a pair of digital to analog converters 60 and 62, for providing the non-linear gain that is necessary to obtain the desired PLL performance, and a summing amplifier 69 to provide a signal to be applied to the motor driver circuitry 100.

The motor speed signal is applied on line 12 to one input of the frequency/phase detector 16, and the reference frequency is applied on another line 14 to another input. The frequency/phase detector 16 operates to detect a phase difference between the two signals, and may be, for example, a commercially available phase detector, such as an MC4044 phase/frequency detector circuit. The frequency/phase detector 16 has two outputs on lines 20 and 22. The output on the line 20 indicates that the reference frequency on line 14 leads the phase motor speed signal on line 12, indicating that the motor speed is less than the desired speed, and needs to be slowed. The output on the line 22 indicates that the phase motor speed signal on line 12 leads the reference frequency on line 14, indicating that the motor speed exceeds the desired speed, and needs to be increased.

In addition, the frequency/phase detector 16 determines the time difference between the occurrence of the incoming pulse edges of the motor speed signal on line 12 and the reference frequency on line 14. The output on either line 20 or 22 from the frequency/phase detector 16 is a pulse of length equal or proportional to the time difference between the active edges of the pulses on lines 12 and 14 to control the counters 30 and 44 to count either up or down for that time. Thus, if the frequency/phase detector 16 detects the falling edge of a motor speed signal pulse on line 12 before it detects a falling edge of the reference frequency on line 14, it will emit a pulse on the "down" line 22 to control the counters 30 and 44 to count down. If the falling edge of the reference frequency on line 14 arrives before the falling edge of the motor speed signal pulse on line 12, the frequency/phase detector 16 emits a pulse on the "up" line 20. As noted, the length of the frequency/phase detector 16 output pulse in any event is equal or proportional to the phase difference of the incoming signals.

Two counters 30 and 44 are connected to receive the up and down signal pulses from the frequency/phase detector 16 on lines 20 and 22. The counter 44 serves as a "fine" counter, and receives clock signals from a clock 23 at a high frequency, for example 2 MHz, on line 42. The output from the "fine" counter 44 appears on a plurality of output lines 40—40, which may be, for example, an 8 bit wide bus.

The outputs from the "fine" counter 44 on lines 40—40 are applied to an over- and underflow detector circuit 24 to produce an output signal on a line 28 to the upper counter 30, in a manner below described, in the event an over- or underflow occurs in the count of the "fine" counter 44.

The function of the counters 30 and 44 can be performed by other types of counters, for instance, counters that have a single input for counting either up or down depending on the sign of the pulse emitted from the phase detector. A qualifying gate pulse also may be provided to gate the clock in such embodiment.

The upper counter 30 serves as a "coarse" counter, and receives clock signals on an input line 36 from an AND gate 34. The clock signals provided by the AND gate 34 represent the logical combination of a low frequency clock signal, for example, 15.6 kHz, from a low frequency clock 25 on the line 32, and the output signal from the over-underflow detector 24. Thus, the 15.6 kHz clock signal is inhibited from clocking the "coarse" counter 30, unless the under-or overflow signal also appears on the line 28. The output from the "coarse" counter 30 appears on output lines 38—38, which may also be an 8 bit bus.

When the counters 30 and 44 are reset, both initialize to count up or down from an intermediate count value centered between their over- and underflow states.

Thus, for example, if the counters are 8-bit counters, when they are reset, they initialize to the count 10000000, from which either an up or down count can be made. Additionally, the counters are of the type that stop counting when an overflow or underflow condition occurs to hold at the over- or underflow count, instead of continuing to count, or wrapping around. The counters are reset after the termination of the counting period generated by either signal on line 20 or line 22. The termination of such signal is detected in an edge detector circuit 26. The edge detector circuit 25 generates "latch" signals on lines 48 and 47 to store the value in the counters 44 and 30 and reset them.

In operation, the "fine" counter 44 counts while a pulse on one of the lines 20 or 22 exists. The direction of the count of the counter 44 depends on which of line 20 or 22 the pulse from the frequency/phase detector 16 exists. The count of clock pulses appears on the output lines 40—40. Likewise, the "coarse" counter 30 counts up or down depending on which of lines 20 or 22 the phase difference pulse from the frequency/phase detector 16 appears. However, since the low frequency clock on line 32 is compared with the state of the signal appearing on line 28, the AND gate 34 blocks the clock pulses, unless the output from the over- and underflow detector 24 indicates the "fine" counter 44 has reached saturation at an over- or underflow condition. When such over- or underflow condition occurs, the "coarse" counter 30 counts clock pulses from the low frequency clock generator 25 on line 32 during the duration of the difference pulse on line 20 or 22. The output count from the "coarse" counter 30 appears on output lines 38—38.

Data latches 52 and 56 receive the data carried on lines 38—38 and 40—40 on their respective inputs. The latch function of each latch 52 and 56 is enabled by a signal on the latch line 48 from the edge detector circuit 26, indicating completion of the phase difference measurement. At this point the data outputs from the respective "fine" and "coarse" counters 44 and 30 are latched into the respective latches 56 and 52. The time in which the phase difference measurement is completed is, for example, when the falling edge of the last occurring pulse of the motor speed signal or the reference frequency occurs, as determined by the edge detector circuit 26.

The output of the latch 52 developed upon lines 54—54 is applied to a "coarse" digital to analog converter circuit 60. Likewise, the output from the latch 56 developed on lines 58—58 is applied to the input of a "fine" digital to analog converter circuit 62. The outputs from the respective "coarse" and "fine" digital to analog converters 60 and 62 are connected to resistors 64 and 66 to be summed on a summing node 63. The values of resistors 64 and 66 can be chosen to weight the relative values of the digital to analog converters 60 and 62, in a manner below described.

The resistors 64 and 66 serve as input resistors to the inverting input 70 of a summing amplifier circuit 69 that includes an operational amplifier 68 having a resistor 76 connected to an analog ground 75 from its non-inverting input terminal 74, and a feedback resistor 72 connected between its output and the inverting input 70. The summing amplifier circuit 69 is biased by the resistor 76 so that the voltage applied to the inverting input 70 by the "coarse" and "fine" digital to analog converters 60 and 62 is equal to the voltage on the analog ground 75 when the digital to analog converters 60 and 62 are driven by the "reset" value (eg., 10000000). The values of the resistors 64, 66 and 72 of the summing amplifier circuit 69 are selected, as indicated above, to provide desired weights to the output signals of the digital to analog converters 60 and 62. For example, the resistor 72 can be provided with a value, R. If the value of resistor 64 is also of value R, the maximum value of the signal at the output node 71 of the amplifier 68 due to the contribution of the digital to analog converter 60 would be the maximum value of the signal at the output of the digital to analog converter 60 times the closed loop gain ($-1$) of the amplifier 68. If the value of the resistor 66 is, for example, 16R, then the contribution of output voltage seen at the output node 71 from a maximum value of the output of the "fine" digital to analog converter 62 would be $-1/16$ the maximum value due to the contribution from the "coarse" digital to analog converter 60.

Figure 2:
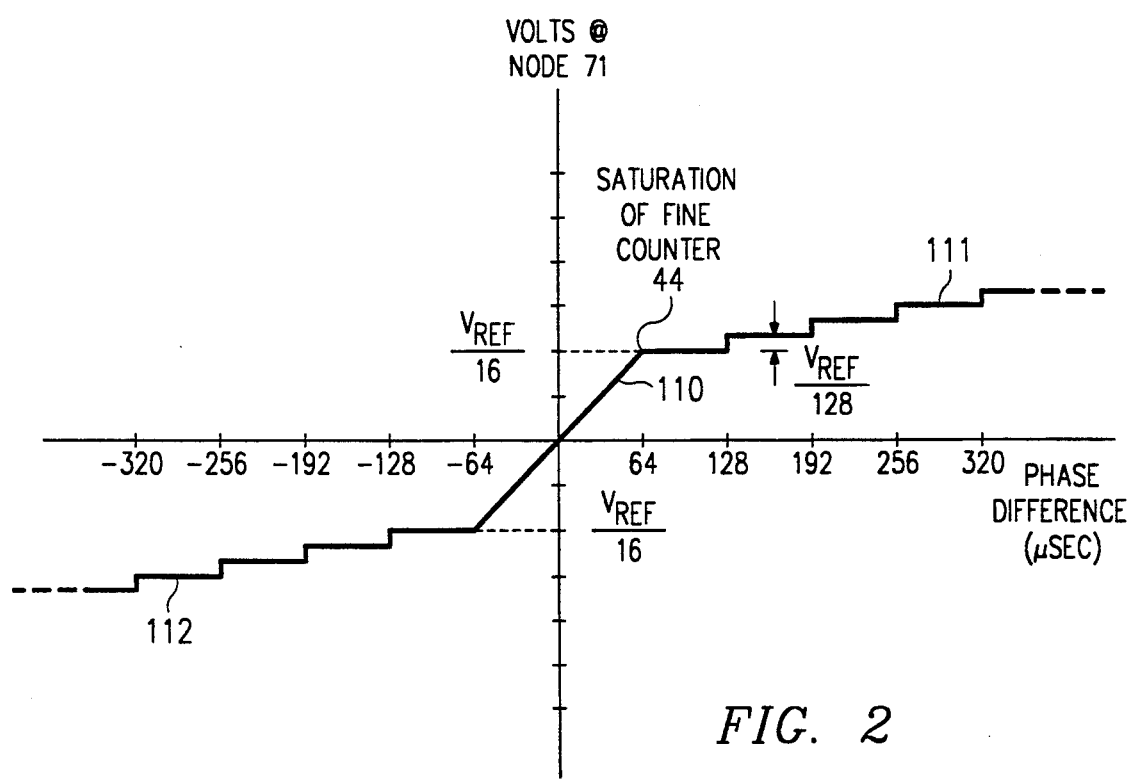
FIG. 2 is a graph of the output voltage of the phase detector circuit as a function of the phase difference between the reference frequency and a motor speed signal.

At this point, it should be noted that by appropriate selection of the clock frequencies applied to the "coarse" and "fine" counters 30 and 44, and the selection of resistor values selected for resistors 64, 66, and 72, the impact of each count of the "coarse" and "fine" counters 30 and 44 can be precisely weighted. For example, assuming that the two digital to analog converters 60 and 62 have the same output range and number of bits, using the various values illustrated, the phase error represented by one count of the "coarse" counter 30 would equal the phase error represented by 128 counts of the "fine" counter 44, while the output voltage change generated by one count of the "coarse" counter 30 would be 16 times that generated by one count of the "fine" counter 44. The resulting output seen at the output node 71, therefore would be as shown in FIG. 2. The slope of the curve in the portion 110 near lock, or close to zero phase difference, is significantly larger than the slope of the lines 111 and 112 as the phase difference increases, away from the lock range.

The voltage output from the summing amplifier circuit 69 on the output node 71 is applied to a filter circuit 80 and an integrator circuit 89 for application to the motor driver circuit 100. The integrator circuit 89 is of known construction, having an operational amplifier 86 and a resistor 94 connected between the non-inverting input terminal 92 and the analog ground 75. The output node 85 of the operational amplifier 86 is connected to the inverting input terminal 84 by a capacitor 90 and resistor 88, connected in series.

The output from the power driver circuit 100 is connected to the motor 102 to control its rotation. As described above, a motor condition indicating signal on line 12, representing, for example, the speed of rotation of the motor, is connected to another input of the frequency/phase detector 16.

In operation, when the motor 102 and the PLL circuit 10 are initially started, a great difference will exist between the frequencies of the motor speed signal on the line 12 and the reference frequency on line 14. During this phase the "fine" counter 44 rapidly counts until it reaches saturation. When this occurs, the over- underflow detector circuit 24 enables the AND gate 34 to pass the 15.6 kHz clock pulses on line 32 to clock the "coarse" counter 30. The "coarse" counter 30 counts the pulses, until the end of the duration of the pulse on the line 20 or its own saturation. At that time, the counts of both the "coarse" and "fine" counters 30 and 44 are latched into the latches 52 and 56. These binary numbers latched by the latches 52 and 56 are converted by the "coarse" digital to analog converter 60 and the "fine" digital to analog converter 62 to respective analog output voltages.

When the PLL circuit 10 is operated within the lock range (i.e., the reference frequency closely matches and tracks the frequency and phase of the motor frequency signal) the "fine" counter 44 no longer saturates between reset pulses and the over- underflow detector circuit 24 no longer enables the AND gate 34 to pass the 15.6 kHz clock signal. In this lock mode, therefore, the "coarse" counter 30 is disabled.

It will be readily appreciated that the "fine" counter 44 with its associated "fine" digital to analog converter 62 generates an output voltage on the resistor 66 that has a high gain, since the number of 2 MHz clock pulses 42 occurring during a phase error period will be relatively large, causing a large voltage gain out of the "fine" digital to analog converter 62. Also, the output of the "coarse" counter 30 and "coarse" digital to analog converter 60 will have a low voltage gain, since the "coarse" counter 30 counts a relatively lower number of pulses from the 15.6 kHz clock during a phase error period, and therefore the digital to analog converter 60 will output an analog voltage with a much lower gain relative to the phase error to the resistor 64.

FIG. 2 depicts the output voltage of the AGC circuit 41 at the output node 71 as a function of the phase difference between the motor speed signal and the reference frequency. This graph shows that if the difference between the edges of the two pulses is less than 64 microseconds, only the "fine" counter 44 can count. Thus, the voltage on the output node 71 is steep from −64 to +64 microseconds. (Depending on the convention chosen, +64 microseconds, might, for example, indicate the motor speed signal has its falling edge +64 microseconds after of a falling edge of the reference signal. In that case, the −64 microsecond time would indicate that the falling edge of the reference frequency occurs 64 microseconds after of the falling edge of the motor speed signal.) This is "high-gain" in the sense that the output signal rises rapidly as a function of time.

At +64 microseconds and −64 microseconds the "fine" counter 44 reaches saturation to enable the "coarse" counter 30. Beyond that point the "staircase" graphs 111 and 112 appear because the gain of the "coarse" counter 30 through the summing amplifier 69 is much larger than the gain of the "fine" counter 44. On the other hand, the time for each step of the "fine" counter 44 is very small, resulting in the straight line appearance of the segment 110 in the scale illustrated. Because the "fine" counter 44 has 256 steps between the −64 microseconds and +64 microseconds times in the graph, the horizontal length per step is also small.

The idea embodied by the AGC circuitry 41 for creating a non-linear gain for the PLL circuit 10 may be extended to create multiple break points in the transfer function (i.e., multiple gain-changes occurring at different points in the operation) by adding more gain paths in parallel.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

We claim:

1. A PLL circuit for generating drive signals to control the speed of a motor according to a reference frequency signal, comprising:
    a circuit for generating a speed signal of frequency proportional to the speed of the motor;
    a phase detector for producing a signal of duration proportional to a phase difference between the speed signal and the reference frequency signal;
    a first phase difference measuring circuit for producing a first output signal at a first gain proportional to said phase difference when said duration of said phase detector signal is less than a predetermined time;
    a second phase difference measuring circuit for producing a second output signal at a second gain when said duration of said phase detector signal is greater than said predetermined time; and
    a node at which said first and second output signals are summed to produce a signal for controlling the speed of the motor.

2. The PLL circuit of claim 1 wherein said first gain is larger than said second gain.

3. The PLL circuit of claim 2 wherein said first and second phase difference measuring circuits are digital circuits.

4. The PLL circuit of claim 3 wherein said first and second phase difference measuring circuits are first and second counters.

5. The PLL circuit of claim 4 wherein said first and second counters are first and second up/down counters.

6. The PLL circuit of claim 5 wherein said first and second up/down counters are initialized to a count midway between a maximum and a minimum count of said counters.

7. The PLL circuit of claim 4 further comprising first and second generators for generating first and second clock signals for respectively clocking said first and second counters.

8. The PLL circuit of claim 7 further comprising an inhibit circuit to inhibit said second clock signal from clocking said second counter until said first counter has counted said predetermined time.

9. The PLL circuit of claim 8 wherein said second clock signal has a period equal to said predetermined time.

10. The PLL circuit of claim 1 further comprising means for weighting said first and second output signals before said first and second output signals are summed.

11. The PLL circuit of claim 10 wherein said first gain is larger than said second gain.

12. The PLL circuit of claim 10 wherein said means for weighting said first and second output signals are respective first and second resistors.

13. The PLL circuit of claim 12 wherein said first and second resistors are sized to weight the output of said second output signal 16 times the weight of said first output signal.

14. The PLL circuit of claim 1 further comprising an integrating filter between said summed first and second output signals and said motor.

15. A PLL circuit for generating drive signals to control the speed of a motor according to a reference frequency signal, comprising:
    a circuit for generating a speed signal of frequency proportional to the speed of the motor;
    a phase detector connected to receive the speed signal for producing a signal of duration proportional to a phase difference between the speed signal and the reference frequency signal;

a phase difference measuring circuit comprising first and second digital up/down counters for: (a) producing a first output signal at a first gain proportional to said phase difference when said duration of said phase detector signal is less than a predetermined time, and (b) producing a second output signal at a second gain less than said first gain when said duration of said phase detector signal is greater than said predetermined time;

a node to which said first and second output signals are applied and summed to produce a summed signal;

and a motor driver circuit to which said summed signal is applied for controlling the speed of the motor.

16. The PLL circuit of claim 15 wherein said digital counters are first and second up/down counters.

17. The PLL circuit of claim 16 wherein said first and second up/down counters are initialized to a count midway between a maximum and a minimum count of said counters.

18. The PLL circuit of claim 16 further comprising first and second generators for generating first and second clock signals for respectively clocking said first and second counters.

19. The PLL circuit of claim 18 further comprising an inhibit circuit to inhibit said second clock signal from clocking said second counter until said first counter has counted said predetermined time.

20. A circuit for automatically controlling the gain applied to a signal for driving a motor in a phase-locked loop circuit, having a low gain during convergence and a high gain when a lock range has been reached, comprising:

frequency detection circuitry for comparing the frequency of a first input signal representing a speed of the motor and the frequency of a second input signal of a reference frequency and emitting a detector output pulse having a duration representing the difference therebetween;

a plurality of digital counters, each for counting clock pulses during respective successive intervals in the duration of said detector output pulse;

a plurality of clock signal generators for clocking a respective one of said counters, each of said clock signal generators generating a clock signal having a frequency proportional to a desired counting circuit output gain;

said counters being connected to count only after saturation of a counter operative during a previous time interval of said detector output pulse, and said clock signals applied to each respective counter that is operative during later intervals being of decreasing frequencies, whereby a discontinuous gain transfer function is produced;

circuitry for converting the binary numbers generated by the counting circuits to analog output voltages; and circuitry for summing said analog output voltages for delivery to drive the motor.

21. A method for generating a drive signal, comprising:

generating a pulse of length proportional to a phase difference between a reference signal and a resultant signal controlled by said drive signal to which the drive signal is to be synchronized, said resultant signal being derived from a motor speed signal;

generating a first voltage control signal at a first gain, said first voltage control signal operative within a first range of phase difference between the resultant signal and a reference signal;

generating a second voltage control signal at a second gain lower than said first gain, said second voltage control signal operative within a second range of phase difference between the resultant signal and a reference signal larger than said first range of phase difference;

said steps of generating first and second voltage control signals comprising counting first and second clock pulses of different frequencies, and generating said first and second voltage control signals from the respective counts;

weighting said first and second voltage control signals to produce weighted first and second voltage control signals;

summing said first and second weighted voltage control signals; and modifying said drive signal in accordance with said summed first and second weighted voltage control signals.

22. The method of claim 21 further comprising inhibiting the counting of said second clock pulses until a predetermined count is reached in counting said first clock pulses.

* * * * *